United States Patent
Mebarki et al.

(10) Patent No.: US 10,354,882 B2
(45) Date of Patent: Jul. 16, 2019

(54) LOW THERMAL BUDGET CRYSTALLIZATION OF AMORPHOUS METAL SILICIDES

(71) Applicant: Applied Materials, Inc., Santa Clara, CA (US)

(72) Inventors: Bencherki Mebarki, Santa Clara, CA (US); Xianmin Tang, San Jose, CA (US); Sundar Ramamurthy, Fremont, CA (US); Jerome Machillot, Brussels (BE)

(73) Assignee: Applied Materials, Inc., Santa Clara, CA (US)

( * ) Notice: Subject to any disclaimer, the term of this patent is extended or adjusted under 35 U.S.C. 154(b) by 0 days.

(21) Appl. No.: 15/963,451

(22) Filed: Apr. 26, 2018

(65) Prior Publication Data

US 2018/0315609 A1 Nov. 1, 2018

Related U.S. Application Data

(60) Provisional application No. 62/490,549, filed on Apr. 26, 2017.

(51) Int. Cl.
*H01L 21/285* (2006.01)
*H01L 21/324* (2006.01)

(52) U.S. Cl.
CPC .... *H01L 21/28518* (2013.01); *H01L 21/2855* (2013.01); *H01L 21/324* (2013.01)

(58) Field of Classification Search
CPC .......... H01L 21/28518; H01L 21/2855; H01L 21/324
See application file for complete search history.

(56) References Cited

U.S. PATENT DOCUMENTS

| | | | |
|---|---|---|---|
| 5,679,585 A * | 10/1997 | Gardner | H01L 21/28518 257/E21.165 |
| 5,977,581 A | 11/1999 | Thakur et al. | |
| 6,140,230 A | 10/2000 | Li | |
| 6,143,634 A * | 11/2000 | Wallace | H01L 21/28176 257/E21.194 |
| 6,251,777 B1 | 6/2001 | Jeng et al. | |
| 6,326,668 B1 | 12/2001 | Li et al. | |
| 7,208,398 B2 | 4/2007 | Chen et al. | |
| 8,358,144 B2 | 11/2013 | Maruyama et al. | |
| 2005/0280118 A1* | 12/2005 | Lin | H01L 21/28061 257/618 |
| 2006/0057014 A1* | 3/2006 | Oda | C04B 35/58085 419/33 |
| 2007/0082468 A1 | 4/2007 | Blalock | |
| 2008/0193359 A1* | 8/2008 | Yu | C30B 29/10 423/344 |
| 2010/0022078 A1* | 1/2010 | Rockenberger | C09D 5/24 438/585 |

* cited by examiner

*Primary Examiner* — Errol V Fernandes
(74) *Attorney, Agent, or Firm* — Servilla Whitney LLC

(57) ABSTRACT

Methods for forming a metal silicide film with low resistivity at low temperature are described. A metal silicide film is formed on a substrate surface and annealed at high pressure and low temperature.

20 Claims, No Drawings

LOW THERMAL BUDGET CRYSTALLIZATION OF AMORPHOUS METAL SILICIDES

CROSS-REFERENCE TO RELATED APPLICATIONS

This application claims priority to U.S. Provisional Application No. 62/490,549, filed Apr. 26, 2017, the entire disclosure of which is hereby incorporated by reference herein.

TECHNICAL FIELD

Implementations described herein generally relate to methods of selective deposition of metal silicide. More specifically, implementations described herein generally relate to methods of forming metal silicide nanowires for semiconductor applications.

BACKGROUND

Integrated circuits have evolved into complex devices that can include millions of components (e.g., transistors, capacitors and resistors) on a single chip. The evolution of chip designs continually necessitates faster circuitry and greater circuit densities. The demand for greater circuit densities necessitates a reduction in the dimensions of the integrated circuit components.

Copper (Cu) interconnects have been used as a replacement for Aluminum (Al) for decades. The number of transistors formed on a substrate is reaching the multi-millions range packed in small areas consistent with Moore's law. As the number of transistors increases and the size of the transistors decreases, Cu resistivity is exponentially increasing once the metal line dimension approaches or gets below the Cu mean free path of 39 nanometers ("nm"). Without being bound by theory, this increased resistivity is believed to be due to surface and sidewall scattering effects.

The post copper era necessitates new interconnect materials that have low resistivity and narrower mean free path. The mean free path is the average distance traveled by a moving particle (such as an electron, an atom, or a photon) between successive impacts (collisions), which modify the direction or energy or other particle properties of the moving particle. Some metals already under investigation include cobalt (Co), tungsten (W), and some metal alloys. Silicides, such as Nickel Silicide (Ni—Si) interconnects and Cobalt Silicide ($CoSi_2$) interconnects are strong potential candidates given the small mean free path of approximately 5 nm for Ni—Si. Even though Ni—Si resistivity is higher than Cu resistivity, the Ni—Si narrow mean free path of approximately 5 nm gives Ni—Si a strong advantage to replace Cu for advanced future technology nodes of 7 nm and below.

However, current processing methods are not amenable to direct device integration for the strong potential candidates. Most studies involving silicide nanowires have been done with freestanding nanowires, as current processing methods can lead to dielectric damage, thermal budget issues, lattice defects and other problems. Regarding thermal budget issues, low resistivity Ni—Si phase formation typically involves high anneal temperatures of greater than 650 degrees Celsius. These high anneal temperatures are not suitable in back-end-of-line (BEOL) integration, due in part to the temperature budget limitation (e.g., less than about 400 degrees Celsius) of most low-k materials. However, annealing Ni—Si at temperatures lower than 650 degrees Celsius leads to volume expansion of the Ni—Si and formation of high resistivity Ni—Si phases.

Therefore, there is a need for methods of forming low resistivity metal silicides at low temperatures that are suitable for semiconductor manufacturing applications.

SUMMARY

One or more embodiments of the disclosure are directed to methods of processing a substrate. A metal silicide film is formed on a surface of a substrate and annealed at a temperature of less than 400° C. and a pressure greater than about 1 bar to form a metal silicide layer with low resistivity.

Additional embodiments of the disclosure are directed to methods of processing a substrate in which a metal silicide film is formed on a surface of the substrate by co-sputtering metal and silicon. The metal silicide film is annealed at a temperature of less than 400 degrees Celsius and a pressure greater than about 5 bar to form a metal silicide layer with low resistivity.

Further embodiments of the disclosure are directed to methods of processing a substrate. A nickel silicide film is formed on a surface of a substrate by co-sputtering nickel and silicon to provide a nickel silicide film with a nickel:silicon ratio in the range of about 0.9:1 to about 1:0.9. The nickel silicide film is annealed at a temperature of less than 400 degrees Celsius in an atmosphere comprising one or more of hydrogen or deuterium and a pressure greater than about 5 bar to form a nickel silicide layer with resistivity less than or equal to about 15 ohms-cm. Annealing the nickel silicide film does not substantially change a crystal structure of the nickel silicide film.

DETAILED DESCRIPTION

Before describing several exemplary embodiments of the disclosure, it is to be understood that the disclosure is not limited to the details of construction or process steps set forth in the following description. The disclosure is capable of other embodiments and of being practiced or being carried out in various ways.

A "substrate" as used herein, refers to any substrate or material surface formed on a substrate upon which film processing is performed during a fabrication process. For example, a substrate surface on which processing can be performed include materials such as silicon, silicon oxide, strained silicon, silicon on insulator (SOI), carbon doped silicon oxides, amorphous silicon, doped silicon, germanium, gallium arsenide, glass, sapphire, and any other materials such as metals, metal nitrides, metal alloys, and other conductive materials, depending on the application. Substrates include, without limitation, semiconductor wafers. Substrates may be exposed to a pretreatment process to polish, etch, reduce, oxidize, hydroxylate, anneal, UV cure, e-beam cure and/or bake the substrate surface. In addition to film processing directly on the surface of the substrate itself, in the present disclosure, any of the film processing steps disclosed may also be performed on an underlayer formed on the substrate as disclosed in more detail below, and the term "substrate surface" is intended to include such underlayer as the context indicates. Thus for example, where a film/layer or partial film/layer has been deposited onto a substrate surface, the exposed surface of the newly deposited film/layer becomes the substrate surface.

Embodiments of the disclosure are directed to methods of forming metal silicide films (e.g., nanowires) at low temperatures for semiconductor applications. One or more embodiments of the disclosure advantageously provide methods of forming low resistivity metal silicide (e.g., Ni—Si) films at low temperatures (e.g., less than 400 degrees Celsius) that are suitable for semiconductor manufacturing applications. The formation of low resistivity metal silicide films typically involves high anneal temperatures of greater than 650 degrees Celsius. However, these high anneal temperatures are not suitable in most semiconductor manufacturing applications, including back-end-of-line (BEOL) integration, due in part to the temperature budget limitation (e.g., less than about 400 degrees Celsius) of low-k materials. However, annealing of metal silicides at temperatures lower than 400 degrees Celsius leads to volume expansion of the metal silicide and formation of high resistivity metal-rich metal silicide phase materials. One or more embodiments of the disclosure advantageously provide methods for forming the low resistivity metal silicide films with low temperature annealing.

Embodiments of the method will be described below in reference to a nickel silicide process that can be carried out using, for example, a suitably adapted CENTURA®, Producer® SE or Producer® GT processing system, available from Applied Materials, Inc. of Santa Clara, Calif. Other tools capable of performing nickel silicide formation may also be adapted to benefit from the implementations described herein. In addition, any system enabling the nickel silicide processes described herein can be used to advantage. The apparatus description described herein is illustrative and should not be construed or interpreted as limiting the scope of the implementations described herein.

Implementations of the present disclosure describe methods for forming a metal silicide layer that may be utilized as conductive nanowires in, for example, back-end interconnect structures for semiconductor device manufacturing. In one example, the metal silicide layer is formed by a deposition process at a temperature less than 400 degrees Celsius. The metal silicide nanowires can be deposited using a cyclic deposition technique. Suitable deposition techniques may be utilized to form the metal silicide layer include plasma enhanced chemical vapor deposition (PECVD), physical vapor deposition process (PVD), metal organic chemical vapor deposition (MOCVD), thermal chemical vapor deposition (Thermal-CVD) process, low pressure chemical vapor deposition (LPCVD), sub-atmosphere chemical vapor deposition (SACVD), atomic layer deposition (ALD), and the like, or any suitable deposition techniques. Implementations disclosed herein are more clearly described with reference to the figures below.

As used herein, unless otherwise stated, reference to nanowires is intended to include other types of nanostructures including nanotubes, nanoparticles, nanospheres, nanorods, nanowhiskers, and the like. Nanowires may have an aspect ratio of greater than one, typically at least about two and more frequently at least about four. In specific implementations, nanowires have an aspect ratio of at least 10 and even at least about 100. Nanowires may make use of their one larger dimension to connect to other semiconductor components.

The method starts with a substrate disposed in the processing chamber. The substrate may include a film stack formed on the substrate. The film stack may include a barrier layer disposed on a low-k insulating dielectric material. In one implementation, the film stack includes a low-k insulating dielectric material deposited on silicon material. In one example, the substrate may have a substantially planar surface, an uneven surface, or a substantially planar surface having a structure formed thereon.

The substrate may be a material such as crystalline silicon (e.g., Si<100> or Si<111>), silicon oxide, strained silicon, silicon germanium, doped or undoped polysilicon, doped or undoped silicon wafers and patterned or non-patterned wafers silicon on insulator (SOI), carbon doped silicon oxides, silicon nitride, doped silicon, germanium, gallium arsenide, glass, sapphire, and combinations thereof. The substrate may have various dimensions, such as 200 mm or 300 mm diameter wafers, as well as, rectangular or square panels. The substrate may be provided as a roll, sheet, discrete substrate, or any other form that is fed into a processing chamber used in one or more of subsequent operations. Unless otherwise noted, the implementations and examples described herein are conducted on discrete substrates with a 200 mm diameter, a 300 mm diameter, a 450 mm diameter substrate, or greater. The substrate may have features formed therein. Exemplary features include trenches, vias, plugs, holes, openings, lines, the like and combinations thereof. In one implementation, the substrate may be an oxide-containing substrate, such as, a silicon oxide containing substrate.

One or more embodiments of the disclosure are directed to methods of forming a metal silicide film on a substrate surface. A metal silicide film is formed on the surface of the substrate and annealed at low temperature and high pressure to form a metal silicide layer with low resistivity.

The metal silicide film can have any suitable metal. In some embodiments, the metal of the metal silicide is selected from the group consisting of Ni, Ti, Fe, Co, Cr, and Mn. In some embodiments, the metal silicide comprises nickel silicide. In some embodiments, the metal silicide is substantially only nickel silicide. As used in this manner, the term "substantially only" means that the sum of the molar ratios of the specified metal and silicon atoms is greater than or equal to about 95%, 98% or 99% of the composition of the metal silicide film.

The metal silicide film can be formed by any suitable technique. In some embodiments, the metal silicide film is formed by physical vapor deposition, chemical vapor deposition, plasma-enhanced chemical vapor deposition, atomic layer deposition or plasma-enhanced atomic layer deposition. In some embodiments, the metal silicide film is formed by physical vapor deposition by co-sputtering the metal and silicon from separate targets or from a single metal silicide target.

In some embodiments, the metal silicide film is formed as a lamination of individual metal and silicon layers. In some embodiments, each layer of the lamination can be deposited by physical vapor. The thickness of the individual layers can be controlled to control the overall metal to silicon atomic ratio in the deposited film. In some embodiments, each layer of the lamination has an average thickness less than or equal to about 10 Å, 8 Å, 6 Å, 4 Å, 3 Å, 2 Å or 1 Å.

The relative composition of the metal and silicon atoms can vary. In some embodiments, the metal silicide is a monosilicide, meaning that the metal to silicon atom ratio is in the range of about 0.8:1 to about 1:0.8, or in the range of about 0.9:1 to about 1:0.9, or in the range of about 0.95:1 to about 1:0.95, or in the range of about 0.96:1 to about 1:0.96, or in the range of about 0.97:1 to about 1:0.97, or in the range of about 0.98:1 to about 1:0.98, or in the range of about 0.99:1 to about 1:0.99. In some embodiments, the metal silicide is nickel monosilicide (NiSi).

In some embodiments, the metal silicide film is a disilicide, meaning that the metal to silicon atom ratio is in the range of about 1.8:1 to about 2.2:1, or in the range of about 1:1.9 to about 1:2.1, or in the range of about 1:1.95 to about 1:2.05, or in the range of about 1:1.96 to about 1:2.04, or in the range of about 1:1.97 to about 1:2.03, or in the range of about 1:1.98 to about 1:2.02, or in the range of about 1:1.99 to about 1:2.01. In some embodiments, the metal silicide is cobalt disilicide ($CoSi_2$).

After formation, the metal silicide film is annealed at low temperature and high pressure. As used in this regard, the term "low temperature" means that the maximum temperature during the annealing process is less than or equal to about 400° C. In some embodiments, the maximum annealing temperature is less than or equal to about 375° C., 350° C., 325° C., 300° C., 275° C., 250° C., 225° C. or 200° C. As used in this regard, the term "high pressure" means a pressure greater than or equal to about 1 bar. In some embodiments, the annealing pressure is greater than or equal to 2 bar, 3 bar, 4 bar, 5 bar, 6 bar, 7 bar, 8 bar, 9 bar, 10 bar, 15 bar, 20 bar, 25 bar, 30 bar, 35 bar, 40 bar, 45 bar, 50 bar, 60 bar, 70 bar, 80 bar, 90 bar or 100 bar. In some embodiments, the annealing pressure is in the range of about 1 bar to about 100 bar, or in the range of about 5 bar to about 80 bar, or in the range of about 10 bar to about 50 bar.

The atmosphere during the annealing process can be varied depending on, for example, the metal silicide film. In some embodiments, the metal silicide film has an annealing atmosphere comprising one or more of hydrogen, deuterium and argon. In some embodiments, the annealing atmosphere comprises about 2% $H_2$ in argon, 4% $H_2$ in argon, 6% $H_2$ in argon, 8% $H_2$ in argon or 10% $H_2$ in argon. In some embodiments, the annealing atmosphere consists essentially of hydrogen in argon. In some embodiments, the annealing atmosphere comprises deuterium. In some embodiments, the annealing atmosphere consists essentially of deuterium. In some embodiments, the annealing atmosphere consists essentially of argon. As used in this manner, the annealing atmosphere "consisting essentially of" a component means that the atmosphere is greater than or equal to about 98%, 99% or 99.5% of the stated component.

The annealing atmosphere can be under static conditions or constant flow conditions. In some embodiments, the annealing atmosphere is static so that annealing occurs substantially without flowing gas. For example, the annealing chamber might be pressurized with the predetermined atmospheric components and then sealed so that there is no flow of gas within the chamber.

Some embodiments of the disclosure advantageously provide methods to bring metal silicides into crystal form by high pressure annealing. The high pressure process can be controlled to transform amorphous metal silicide into crystal form without negative damaging effects on low-k materials. In some embodiments, annealing the metal silicide changes greater than or equal to about 50%, 60%, 70%, 80%, 90% or 95% of the volume of material to the crystal form. For example, if a nickel silicide film was 100% amorphous, high pressure annealing can convert at least about 50% of the amorphous nickel silicide to crystallized nickel silicide.

The annealed metal silicide film has a resistivity less than or equal to about 20 ohms-cm, 19 ohms-cm, 18 ohms-cm, 17 ohms-cm, 16 ohms-cm, 15 ohms-cm, 14 ohms-cm, 13 ohms-cm, 12 ohms-cm, 11 ohms-cm or 10 ohms-cm.

The total thickness of the annealed metal silicide layer can be greater than or equal to about 5 Å, 10 Å, 15 Å, 20 Å, 25 Å, 30 Å, 35 Å, 40 Å, 45 Å or 50 Å. In some embodiments, the total thickness of the annealed metal silicide layer is in the range of about 10 Å to about 150 Å, or in the range of about 10 Å to about 100 Å.

Though described above with relation to nickel, metal silicide can include other metals species. According to one embodiment, the metal species in the metal silicide nanowire can also be varied depending on the application and material properties desired, such as conductivity, bandgap, work function and phase. Example metal species of interest for nanowires include Ni, Ti, Fe, Co, Cr, Mn, or other transition metal elements. The method of fabricating these nanowires can include delivery of silicon to the metal surface, delivery of the metal to silicon nanowires, or simultaneous delivery of silicon and the metal species.

According to one or more embodiments, the substrate is subjected to processing prior to and/or after forming the layer. This processing can be performed in the same chamber or in one or more separate processing chambers. In some embodiments, the substrate is moved from the first chamber to a separate, second chamber for further processing. The substrate can be moved directly from the first chamber to the separate processing chamber, or it can be moved from the first chamber to one or more transfer chambers, and then moved to the separate processing chamber. Accordingly, the processing apparatus may comprise multiple chambers in communication with a transfer station. An apparatus of this sort may be referred to as a "cluster tool" or "clustered system," and the like.

Generally, a cluster tool is a modular system comprising multiple chambers which perform various functions including substrate center-finding and orientation, degassing, annealing, deposition and/or etching. According to one or more embodiments, a cluster tool includes at least a first chamber and a central transfer chamber. The central transfer chamber may house a robot that can shuttle substrates between and among processing chambers and load lock chambers. The transfer chamber is typically maintained at a vacuum condition and provides an intermediate stage for shuttling substrates from one chamber to another and/or to a load lock chamber positioned at a front end of the cluster tool. Two well-known cluster tools which may be adapted for the present disclosure are the Centura® and the Endura®, both available from Applied Materials, Inc., of Santa Clara, Calif. However, the exact arrangement and combination of chambers may be altered for purposes of performing specific steps of a process as described herein. Other processing chambers which may be used include, but are not limited to, cyclical layer deposition (CLD), atomic layer deposition (ALD), chemical vapor deposition (CVD), physical vapor deposition (PVD), etch, pre-clean, chemical clean, thermal treatment such as RTP, plasma nitridation, degas, orientation, hydroxylation and other substrate processes. By carrying out processes in a chamber on a cluster tool, surface contamination of the substrate with atmospheric impurities can be avoided without oxidation prior to depositing a subsequent film.

According to one or more embodiments, the substrate is continuously under vacuum or "load lock" conditions, and is not exposed to ambient air when being moved from one chamber to the next. The transfer chambers are thus under vacuum and are "pumped down" under vacuum pressure. Inert gases may be present in the processing chambers or the transfer chambers. In some embodiments, an inert gas is used as a purge gas to remove some or all of the reactants. According to one or more embodiments, a purge gas is injected at the exit of the deposition chamber to prevent reactants from moving from the deposition chamber to the transfer chamber and/or additional processing chamber. Thus, the flow of inert gas forms a curtain at the exit of the chamber.

The substrate can be processed in single substrate deposition chambers, where a single substrate is loaded, processed and unloaded before another substrate is processed. The substrate can also be processed in a continuous manner, similar to a conveyer system, in which multiple substrate are individually loaded into a first part of the chamber, move through the chamber and are unloaded from a second part of the chamber. The shape of the chamber and associated conveyer system can form a straight path or curved path. Additionally, the processing chamber may be a carousel in which multiple substrates are moved about a central axis and are exposed to deposition, etch, annealing, cleaning, etc. processes throughout the carousel path.

During processing, the substrate can be heated or cooled. Such heating or cooling can be accomplished by any suitable means including, but not limited to, changing the temperature of the substrate support and flowing heated or cooled gases to the substrate surface. In some embodiments, the substrate support includes a heater/cooler which can be controlled to change the substrate temperature conductively. In one or more embodiments, the gases (either reactive gases or inert gases) being employed are heated or cooled to locally change the substrate temperature. In some embodiments, a heater/cooler is positioned within the chamber adjacent the substrate surface to convectively change the substrate temperature.

The substrate can also be stationary or rotated during processing. A rotating substrate can be rotated continuously or in discreet steps. For example, a substrate may be rotated throughout the entire process, or the substrate can be rotated by a small amount between exposures to different reactive or purge gases. Rotating the substrate during processing (either continuously or in steps) may help produce a more uniform deposition or etch by minimizing the effect of, for example, local variability in gas flow geometries.

Reference throughout this specification to "one embodiment," "certain embodiments," "one or more embodiments" or "an embodiment" means that a particular feature, structure, material, or characteristic described in connection with the embodiment is included in at least one embodiment of the disclosure. Thus, the appearances of the phrases such as "in one or more embodiments," "in certain embodiments," "in one embodiment" or "in an embodiment" in various places throughout this specification are not necessarily referring to the same embodiment of the disclosure. Furthermore, the particular features, structures, materials, or characteristics may be combined in any suitable manner in one or more embodiments.

Although the disclosure herein has been described with reference to particular embodiments, it is to be understood that these embodiments are merely illustrative of the principles and applications of the present disclosure. It will be apparent to those skilled in the art that various modifications and variations can be made to the method and apparatus of the present disclosure without departing from the spirit and scope of the disclosure. Thus, it is intended that the present disclosure include modifications and variations that are within the scope of the appended claims and their equivalents.

What is claimed is:

1. A method of processing a substrate, the method comprising:
    forming a nickel silicide film on a surface of a substrate by co-sputtering nickel and silicon to provide a nickel silicide film with a nickel:silicon ratio in the range of about 0.9:1 to about 1:0.9; and
    annealing the nickel silicide film at a temperature of less than 400 degrees Celsius in an atmosphere comprising one or more of hydrogen or deuterium and a pressure greater than about 5 bar to form a nickel silicide layer with resistivity less than or equal to about 15 ohms-cm, wherein annealing the metal silicide film changes greater than or equal to about 50% of a volume of the metal silicide film to crystal form.

2. The method of claim 1, wherein a majority of the nickel silicide film is nickel monosilicide (NiSi) phase.

3. The method of claim 1, wherein the nickel silicide layer has a thickness between about 10 Å and about 100 Å.

4. The method of claim 1, wherein the nickel silicide layer is formed as nanowires for semiconductor back-end interconnection structure.

5. The method of claim 1, wherein annealing the nickel silicide film occurs at a temperature less than or equal to about 350 degrees Celcius.

6. The method of claim 1, wherein annealing the nickel silicide film occurs at a temperature less than or equal to about 300 degrees Celcius.

7. The method of claim 1, wherein annealing the nickel silicide film occurs at a temperature less than or equal to about 250 degrees Celcius.

8. The method of claim 1, wherein annealing the nickel silicide film occurs at a temperature less than or equal to about 200 degrees Celcius.

9. The method of claim 1, wherein annealing the nickel silicide film occurs at a pressure greater than or equal to 10 bar.

10. The method of claim 1, wherein annealing the nickel silicide film occurs at a pressure greater than or equal to 25 bar.

11. The method of claim 1, wherein annealing the nickel silicide film occurs at a pressure greater than or equal to 50 bar.

12. The method of claim 1, wherein annealing the metal silicide film occurs in an atmosphere comprising about 4% $H_2$ in argon.

13. The method of claim 1, wherein annealing the nickel silicide film occurs in an atmosphere comprising about 6% $H_2$ in argon.

14. The method of claim 1, wherein annealing the nickel silicide film occurs in an atmosphere comprising about 10% $H_2$ in argon.

15. The method of claim 1, wherein annealing occurs in an atmosphere consisting essentially of deuterium.

16. The method of claim 1, wherein annealing occurs in an atmosphere consisting essentially of argon.

17. The method of claim 1, wherein annealing the metal silicide film changes greater than or equal to about 50% of a volume of the metal silicide film to crystal form.

18. The method of claim 1, wherein annealing the nickel silicide film changes greater than or equal to about 70% of a volume of the nickel silicide to crystal form.

19. The method of claim 1, wherein annealing the metal silicide film occurs substantially without flowing gas.

20. The method of claim 1, wherein the nickel silicide layer has a resistivity less than or equal to about 12 ohms-cm.

* * * * *